(12) United States Patent
Creak et al.

(10) Patent No.: US 12,379,403 B2
(45) Date of Patent: Aug. 5, 2025

(54) SENSOR ASSEMBLY OUTPUTTING A CONDITION OF A SENSOR

(71) Applicant: Measurement Specialties, Inc., Hampton, VA (US)

(72) Inventors: Jeffrey Creak, Hampton, VA (US); Michael Pedrick, Hampton, VA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 199 days.

(21) Appl. No.: 17/828,421

(22) Filed: May 31, 2022

(65) Prior Publication Data

US 2023/0384354 A1 Nov. 30, 2023

(51) Int. Cl.
*G01R 19/00* (2006.01)
*G01R 1/04* (2006.01)

(52) U.S. Cl.
CPC ....... *G01R 19/0038* (2013.01); *G01R 1/0408* (2013.01); *G01R 19/0007* (2013.01)

(58) Field of Classification Search
CPC .............. G01R 19/0038; G01R 1/0408; G01R 19/0007
See application file for complete search history.

(56) References Cited

U.S. PATENT DOCUMENTS

| | | | |
|---|---|---|---|
| 4,951,030 A * | 8/1990 | Jones | D04B 35/12 340/661 |
| 10,067,153 B2 * | 9/2018 | Kasuya | G01P 1/006 |
| 2010/0122565 A1 | 5/2010 | Miller et al. | |
| 2010/0237890 A1* | 9/2010 | Motz | G01R 31/31709 324/750.3 |
| 2022/0397593 A1* | 12/2022 | Stoica | G01R 31/2843 |
| 2023/0314258 A1* | 10/2023 | Mihaescu | G01L 27/007 73/1.57 |

FOREIGN PATENT DOCUMENTS

| | | |
|---|---|---|
| JP | S61213727 A | 9/1966 |
| JP | H06274778 A | 9/1994 |
| JP | 2017083226 A | 5/2017 |
| JP | 2018159636 A * | 10/2018 |

OTHER PUBLICATIONS

Japanese Office Action with English translation thereof, dated Jul. 2, 2024 in Application No. 2023-087470, 14 pages.

* cited by examiner

*Primary Examiner* — Daniel C Puentes

(57) ABSTRACT

A sensor assembly includes a sensor generating a sensor signal, an output unit and a condition unit receiving the sensor signal output from the sensor, and a test line connected to the sensor and the condition unit. The output unit outputs a signal output representative of a state detected by the sensor. The condition unit outputs a condition output representative of a condition of the sensor. The test line is bidirectional and outputs the condition output.

22 Claims, 6 Drawing Sheets

SENSOR ASSEMBLY OUTPUTTING A CONDITION OF A SENSOR

FIELD OF THE INVENTION

The present invention relates to a sensor assembly and, more particularly, to a sensor assembly that outputs a condition of a sensor of the sensor assembly.

BACKGROUND

A sensor of a sensor assembly commonly has an output line or pin and an input line or pin. A signal representing a variable sensed by the sensor is output on the output line. The input line is used to input a self-test signal to the sensor to determine whether the sensor is functioning properly; in response to receiving the self-test signal, the sensor outputs a predetermined signal that can be assessed to determine whether the sensor is in a failed condition.

Although the self-test can indicate failure of the sensor, the condition of the sensor is only output on-demand when the self-test signal is received. The condition of the sensor is otherwise unknown and the sensor could be outputting unreliable signals prior to a failure determination initiated by the self-test signal. Further, the assessment of the predetermined signal output from the sensor in the self-test only indicates whether the sensor is working or whether the sensor has already reached a failure condition. The output of the sensor prompted by the self-test signal is not capable of providing any intermediate indication as the sensor is approaching failure.

SUMMARY

A sensor assembly includes a sensor generating a sensor signal, an output unit and a condition unit receiving the sensor signal output from the sensor, and a test line connected to the sensor and the condition unit. The output unit outputs a signal output representative of a state detected by the sensor. The condition unit outputs a condition output representative of a condition of the sensor. The test line is bidirectional and outputs the condition output.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
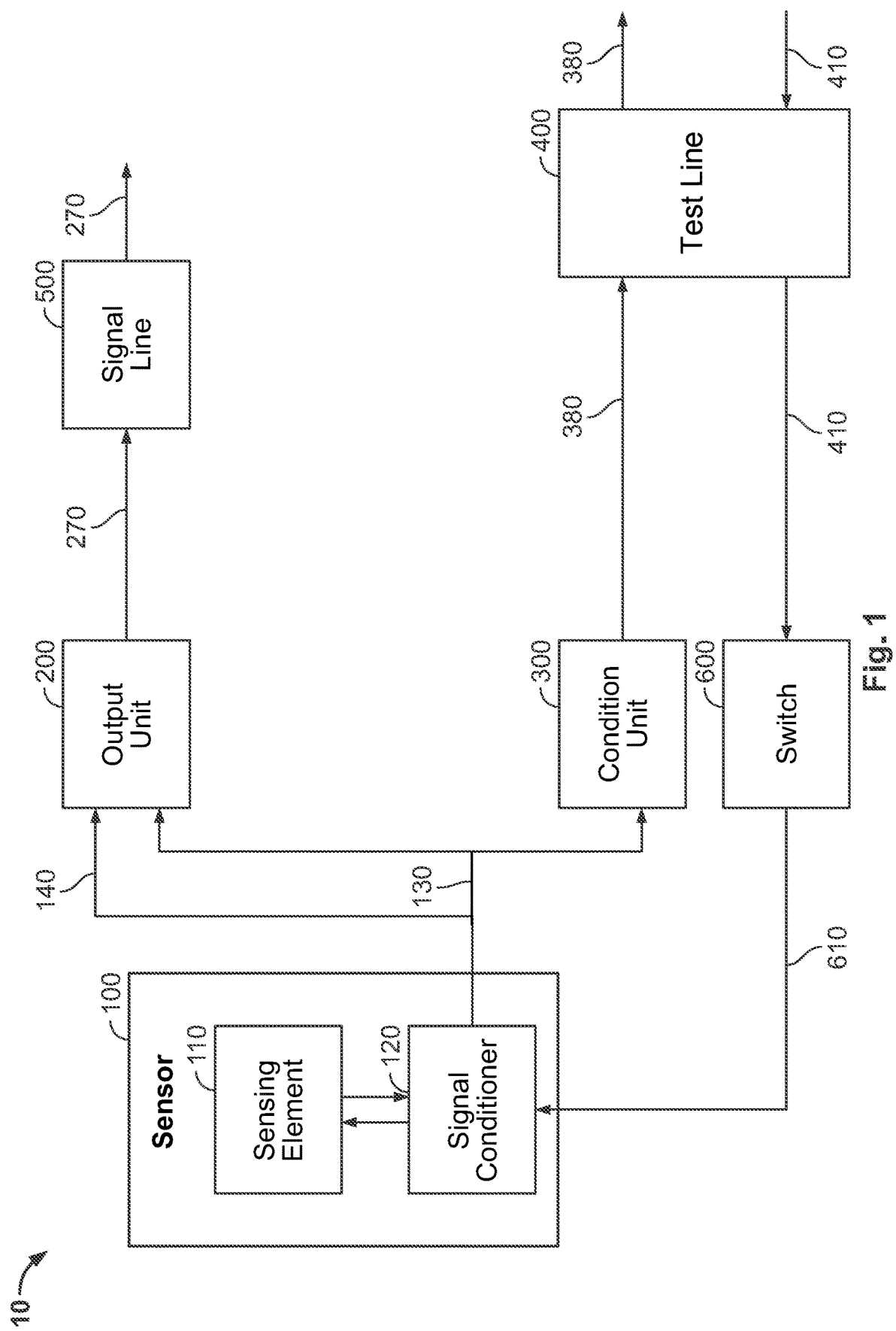
FIG. 1 is a schematic block diagram of a sensor assembly according to an embodiment.

Exemplary embodiments of the present disclosure will be described hereinafter in detail with reference to the attached drawings, wherein like reference numerals refer to like elements. The present disclosure may, however, be embodied in many different forms and should not be construed as being limited to the embodiments set forth herein; rather, these embodiments are provided so that the present disclosure will convey the concept of the disclosure to those skilled in the art. In addition, in the following detailed description, for purposes of explanation, numerous specific details are set forth to provide a thorough understanding of the disclosed embodiments. However, it is apparent that one or more embodiments may also be implemented without these specific details.

A sensor assembly 10 according to an embodiment is shown in FIG. 1. The sensor assembly 10 comprises a sensor 100, an output unit 200 connected to the sensor 100, a condition unit 300 connected to the sensor 100, a test line 400 connected to the condition unit 300 via a switch 600, and a signal line 500 connected to the output unit 200.

The sensor 100, as shown in FIG. 1, includes a sensing element 110 and a signal conditioner 120. The sensing element 110 senses a state of a measured variable and the signal conditioner 120 interacts with the sensing element 110 based on a drive signal to generate and output a sensor signal 130 representative of the state sensed by the sensing element 110.

In an embodiment, the signal conditioner 120 is a piezoelectric crystal that generates an ultrasonic wave and the sensing element 110 is a piezoelectric crystal that receives the ultrasonic wave and translates the ultrasonic wave into an electrical signal based on the state sensed by the sensing element 110. In another embodiment, the sensing element 110 and the signal conditioner 120 can be a single piezoelectric transceiver, for example operating in a pulse echo mode. In further embodiments, the signal conditioner 120 can be any type of element that provides an excitation signal and the sensing element 110 can be any type of element that provides a response signal to the excitation signal from the signal conditioner 120 representing the state sensed by the sensing element 110. The signal conditioner 120, in various embodiments, could further include components for voltage regulation, filtering, amplification, and/or buffering, provided that the signal conditioner 120 receives the state of the measured variable from the sensing element 110 and outputs the sensor signal 130 as a measurable electrical signal, such as a voltage signal. In an embodiment, the switch 600 described in detail below could be part of the signal conditioner 120.

In an embodiment, the sensing element 110 detects the presence of moisture, for example detecting whether a liquid filling a tube has a bubble (dry state in otherwise wet state) present in the liquid, such as in medical applications. In other embodiments, the sensing element 110 may detect an acceleration, a force, a vibration, a pressure, or other measured variables for various applications.

In a normal operating state N of the sensor assembly 10, the sensor 100 outputs the sensor signal 130 to each of the output unit 200 and the condition unit 300. The normal operating state N will be described in greater detail first, followed by a description of a self-test state S of the sensor assembly 10.

In the normal operating state N, as shown in FIG. 1, the output unit 200 receives the sensor signal 130 output from the sensor 100 and outputs a signal output 270 representative of the sensor signal 130 and the state detected by the sensor signal 130.

Figure 2:
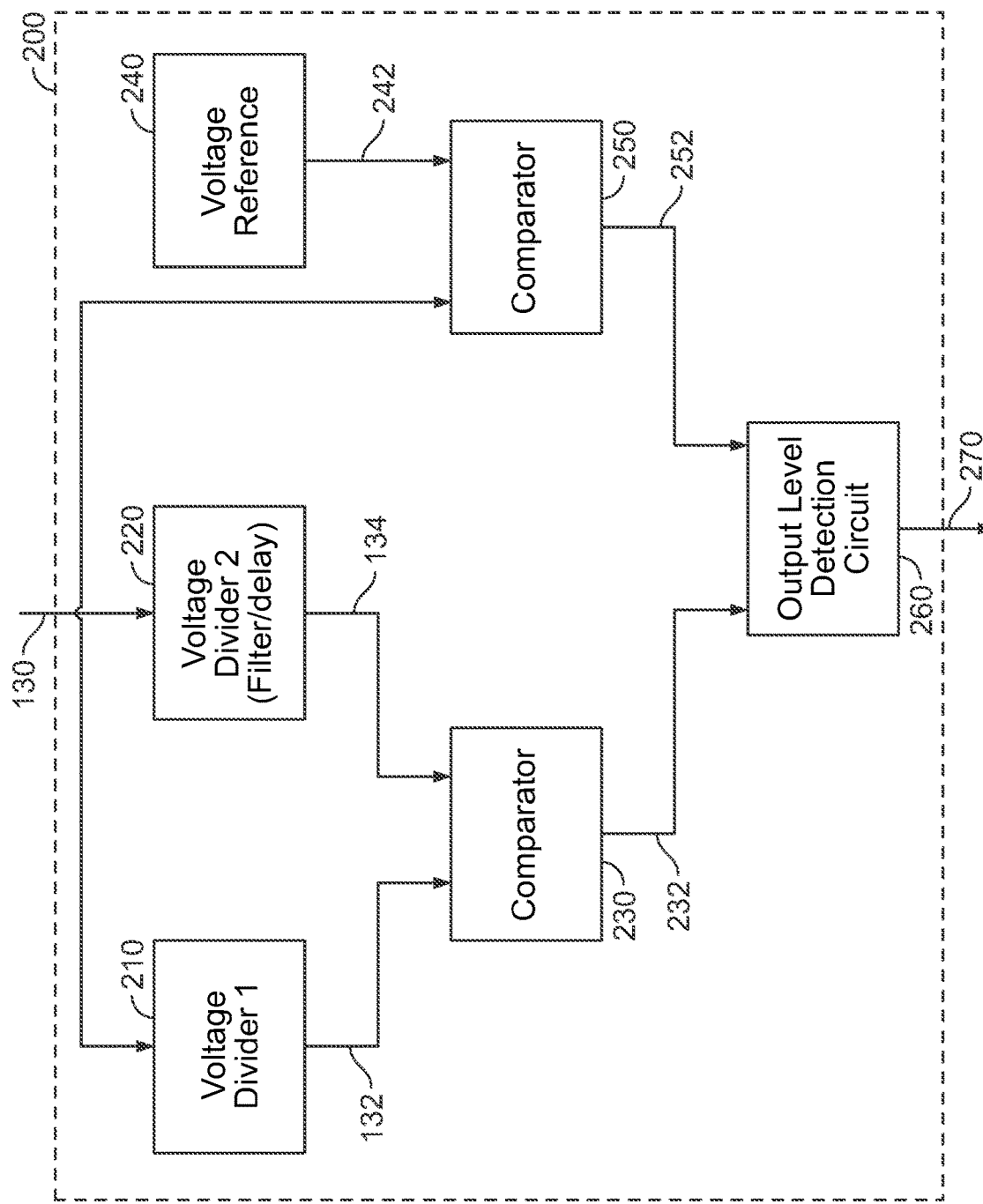
FIG. 2 is a schematic block diagram of an output unit of the sensor assembly.

The output unit 200, as shown in FIG. 2, includes a first output voltage divider 210, a second output voltage divider 220, and a first output comparator 230 connected to the first output voltage divider 210 and the second output voltage divider 220. The first output voltage divider 210 and the second output voltage divider 220 each receive the sensor signal 130. The first output voltage divider 210 outputs a main signal 132 that is directly representative of the sensor signal 130 and varies with the sensor signal 130. In the shown embodiment, the second output voltage divider 220 filters or delays the sensor signal 130 to create a baseline signal 134 that has a dynamic response or variation at a longer time constant or a lower frequency than the sensor signal 130 and the main signal 132.

Figure 4A:
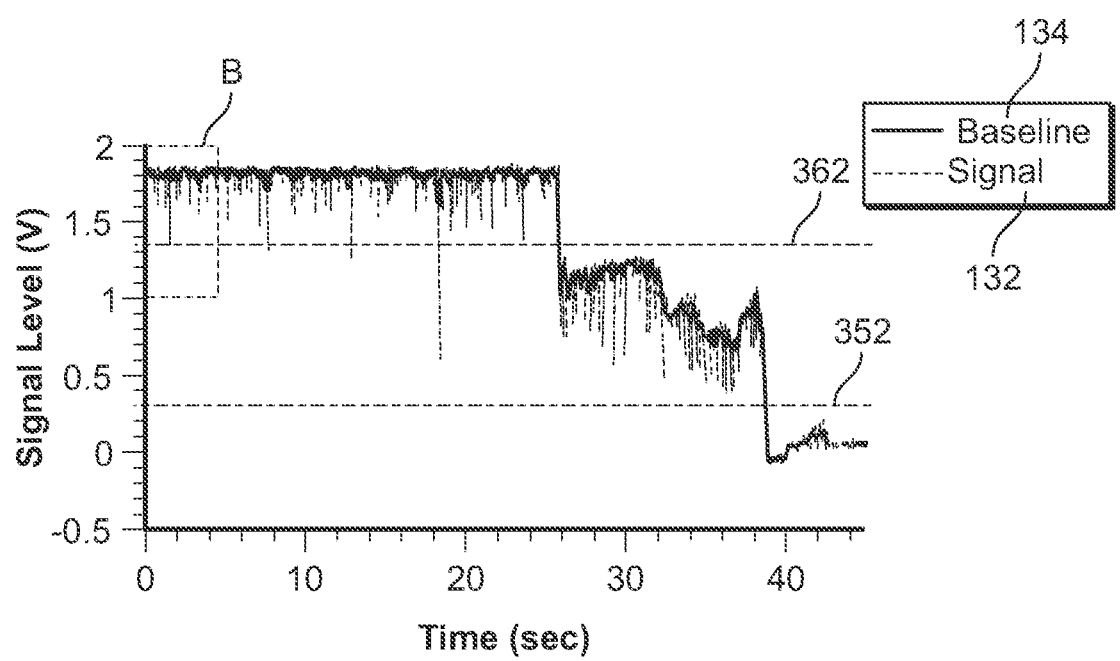
FIG. 4A is a graph of a main signal and a baseline signal of a sensor of the sensor assembly with a first threshold and a second threshold.
Figure 4B:
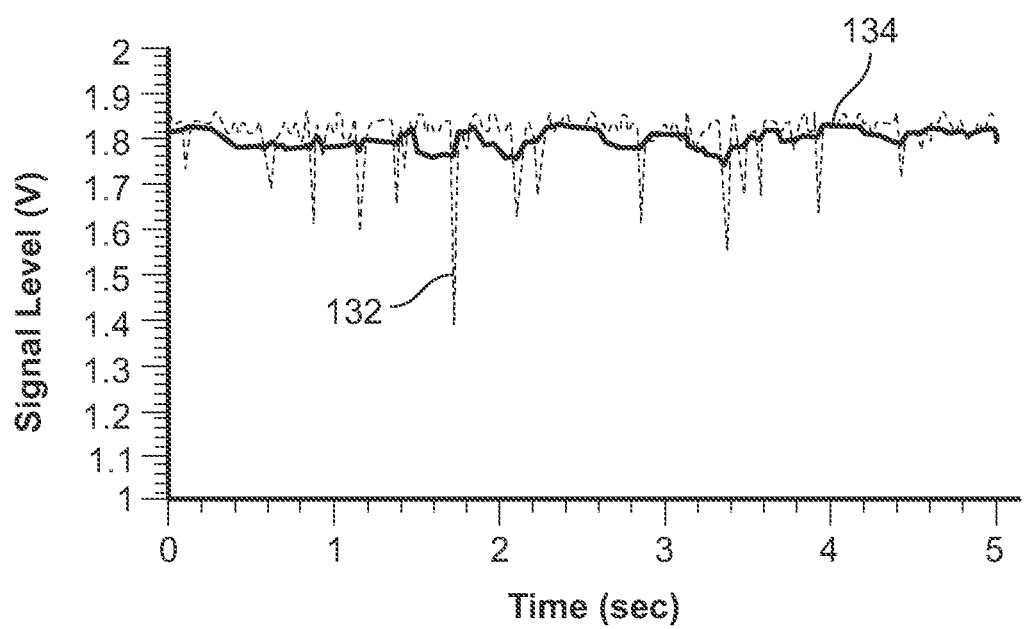
FIG. 4B is an enlarged portion B of the graph of FIG. 4A.

The main signal 132 and the baseline signal 134 are shown in FIGS. 4A and 4B, which show that the main signal 132 is a more dynamic response of the state detected by the sensor 100 than the baseline signal 134. The sensor 100, in various embodiments, may be any type of sensor 100 having the baseline signal 134 indicative of overall sensor behavior, performance, or efficiency and the main signal 132 more dynamically indicative of the measured state detected by the sensing element 110.

The first output comparator 230 shown in FIG. 2 compares the main signal 132 and the baseline signal 134 and outputs a first output comparison 232 representative of whether the main signal 132 is greater than or less than the baseline signal 134. The first output comparison 232 is a voltage signal in an embodiment. The first output comparison 232 varies in the exemplary graphs of the main signal 132 and the baseline signal 134 shown in FIGS. 4A and 4B as, over time, the main signal 132 varies to be greater than or less than the baseline signal 134.

As shown in FIG. 2, the output unit 200 includes a voltage reference 240 and a second output comparator 250 connected to the voltage reference 240. The voltage reference 240 may be any type of electronic component that outputs a reference voltage 242 having a preset value. The second output comparator 250 receives the sensor signal 130 and the reference voltage 242 and compares the sensor signal 130 and the reference voltage 242. The second output comparator 250 outputs a second output comparison 252 representative of whether the sensor signal 130 is greater than or less than the reference voltage 242.

As shown in FIG. 2, the output unit 200 includes an output level detection circuit 260 that receives the first output comparison 232 from the first output comparator 230 and receives the second output comparison 252 from the second output comparator 250. The output level detection circuit 260 outputs the signal output 270 based on the first output comparison 232 and the second output comparison 252. If the first output comparison 232 indicates that the baseline signal 134 is greater than the main signal 132, the output level detection circuit 260 outputs the signal output 270 in a first state. Conversely, if the first output comparison 232 indicates that the main signal 132 is greater than the baseline signal 134, the output level detection circuit 260 outputs the signal output 270 in a second state. An exemplary relationship between the main signal 132 and the baseline signal 134 over time that dictates the state of the signal output 270 is shown in FIG. 4B.

The second output comparison 252 fed to the output level detection circuit 260 prevents issues with the first output comparator 230 from impacting the signal output 270. If the first output comparator 230 is oscillating or malfunctioning, the output level detection circuit 260 will consistently indicate one of the first state and the second state of the signal output 270 due to the second output comparison 252.

In an embodiment, the signal output 270 is a 0V signal in the first state, for example indicating a wet state in the application sensing liquid in a tube, and is a 5V signal in the second state, for example indicating a dry state or a bubble in the liquid in the tube. In other embodiments, the voltages of the signal output 270 used to indicate the first state and the second state may be reversed or may otherwise have different values.

In the normal operating state N, as shown in FIG. 1, the condition unit 300 receives the sensor signal 130 output from the sensor 100 and outputs a condition output 380 representative of a condition of the sensor 100.

Figure 3:
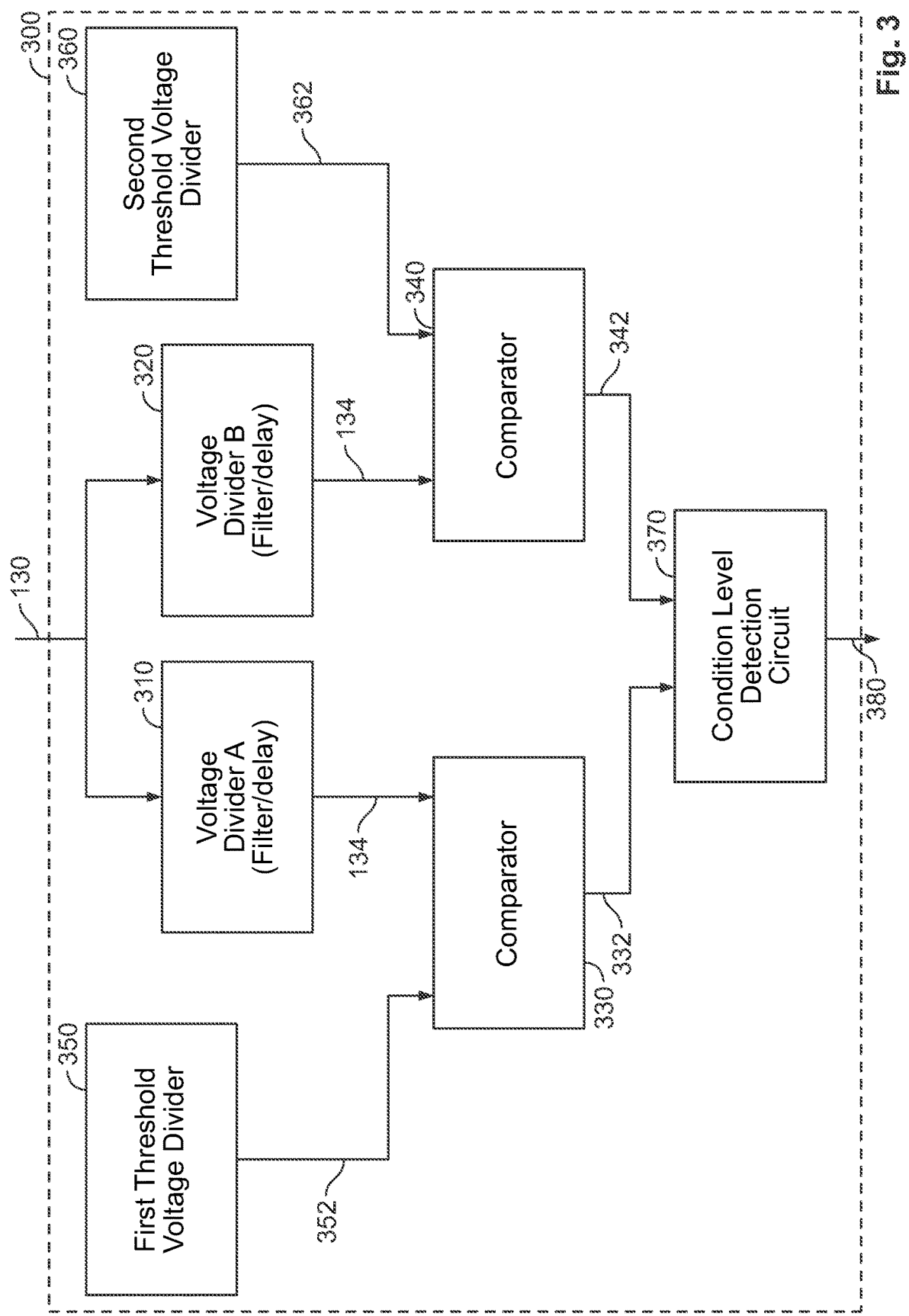
FIG. 3 is a schematic block diagram of a condition unit of the sensor assembly.

The condition unit 300, as shown in FIG. 3, includes a first condition voltage divider 310 and a second condition voltage divider 320 each receiving the sensor signal 130. The first condition voltage divider 310 and the second condition voltage divider 320 each filter or delay the sensor signal 130 to output the baseline signal 134 described above.

As shown in FIG. 3, the condition unit 300 includes a first condition comparator 330 connected to the first condition voltage divider 310 and a first threshold voltage divider 350 and a second condition comparator 340 connected to the second condition voltage divider 320 and a second threshold voltage divider 360. The first threshold voltage divider 350 outputs a first threshold 352 that is a preset voltage value to the first condition comparator 330 and the second threshold voltage divider 360 outputs a second threshold 362 that is a preset voltage different form the first threshold 352 to the second condition comparator 340. Each of the first threshold voltage divider 350 and the second threshold voltage divider 360 may receive a voltage to output the first threshold 352 and the second threshold 362 from any source internal to or external from the sensor assembly 10. In an embodiment, as shown for example in FIG. 4A, the first threshold 352 may be approximately 0.3V and the second threshold 362 may be approximately 1.3V. In other embodiments, the first threshold 352 and the second threshold 362 may have other values, provided that the values are different from one another and the second threshold 362 is greater than the first threshold 352.

The first condition comparator 330 shown in FIG. 3 compares the baseline signal 134 and the first threshold 352 and outputs a first condition comparison 332 representative of whether the baseline signal 134 is greater than or less than the first threshold 352. The second condition comparator 340 likewise compares the baseline signal 134 and the second threshold 362 and outputs a second condition comparison 342 representative of whether the baseline signal 134 is greater than or less than the second threshold 362. The first condition comparison 332 and the second condition comparison 342 are each a voltage signal in an embodiment.

As shown in FIG. 3, the condition unit 300 includes a condition level detection circuit 370 that receives the first condition comparison 332 from the first condition comparator 330 and receives the second condition comparison 342 from the second condition comparator 340. The condition level detection circuit 370 outputs the condition output 380 based on the first condition comparison 332 and the second condition comparison 342. The condition output 380 represents one of three conditions of the sensor 100: if the baseline signal 134 is indicated as greater than both the first threshold 352 and the second threshold 362 by the first condition comparison 332 and the second condition comparison 342, the condition output 380 is in a first condition; if the baseline signal 134 is indicated as greater than the first threshold 352 and less than the second threshold 362, the condition output 380 is in a second condition; if the baseline signal 134 is indicated as less than both the first threshold 352 and the second threshold 362, the condition output 380 is in a third condition. An exemplary relationship between the baseline signal 134 and the thresholds 352, 362 over time that dictates the condition of the condition output 380 is shown in FIG. 4A.

In the shown embodiment, the baseline signal 134 is compared to one lower first threshold 352 and one higher second threshold 362. In another embodiment, the baseline signal 134 may be compared to a pair of first thresholds 352 and a pair of second thresholds 362 if it is possible that the baseline signal 134 can also increase beyond a desired quantity; in this embodiment, the baseline signal 134 between the second thresholds 362 indicates the first condition, the baseline signal 134 between one of the second thresholds 362 and one of the first thresholds 352 indicates the second condition, and the baseline signal 134 outside of either of the first thresholds 352 indicates the third condition.

In an embodiment, the condition output 380 is a 0V signal in the first condition, for example indicating a normal condition of the sensor 100, is a 1.25V signal in the second condition, for example indicating a marginal condition of the sensor 100, and is a 2.5V signal in the third condition, for example indicating a failure condition of the sensor 100. In another embodiment, the condition output 380 may be a 2.5V signal in both the second condition and the third condition. In further embodiments, the voltages of the condition output 380 used to indicate the three conditions may be reversed or may otherwise have different values.

The test line 400 and the signal line 500, shown in FIG. 1, are two lines connected to the sensor 100 along which signals are transmitted. The test line 400 and the signal line 500 may each be transistor-transistor logic (TTL) lines. The test line 400 and the signal line 500 are referred to as "lines" herein but, in another embodiment, may be two pins connected to the sensor 100 along which signals are transmitted. In the shown embodiment, the test line 400 and the signal line 500 are the only two lines or pins along which signals can be exchanged with the sensor 100.

As shown in FIG. 1, the test line 400 is connected to the sensor 100 through the condition unit 300, and is also connected to the switch 600. The test line 400 is bidirectional. In the normal operating state N, the test line 400 receives the condition output 380 from the condition unit 300 and outputs the condition output 380. A self-test input 410 can also be input to the test line 400, which can trigger the switch 600 to change the sensor assembly 10 from the normal operating state N to the self-test state S, as described in greater detail below.

As shown in FIG. 1, the signal line 500 is connected to the sensor 100 and the output unit 200. The signal line 500 is unidirectional, i.e. is incapable of receiving input, and outputs the signal output 270 received from the output unit 200.

The switch 600, shown in FIG. 1, may be any type of electrical circuit switch that can switch when a threshold voltage is exceeded. In an embodiment, the switch 600 is a metal-oxide-semiconductor field-effect transistor (MOSFET) switch. The threshold voltage of the switch 600 is greater than the voltage of all of the conditions of the condition output 380 and is less than the voltage of the self-test input 410. In an embodiment, the threshold voltage is between 2.5V and 5V.

A method 700 for outputting a condition of the sensor 100 using the sensor assembly 10 will now be described in greater detail primarily with reference to FIG. 5.

The sensor assembly 10 starts in the normal operating state N. In a first step 702 of the normal operating state N, shown in FIG. 5, the sensor 100 outputs the sensor signal 130 to the output unit 200 and the condition unit 300 as described above, as shown in FIG. 1. The sensor 100 continuously outputs or transmits the sensor signal 130 to both the output unit 200 and the condition unit 300 in the normal operating state N.

Figure 5:
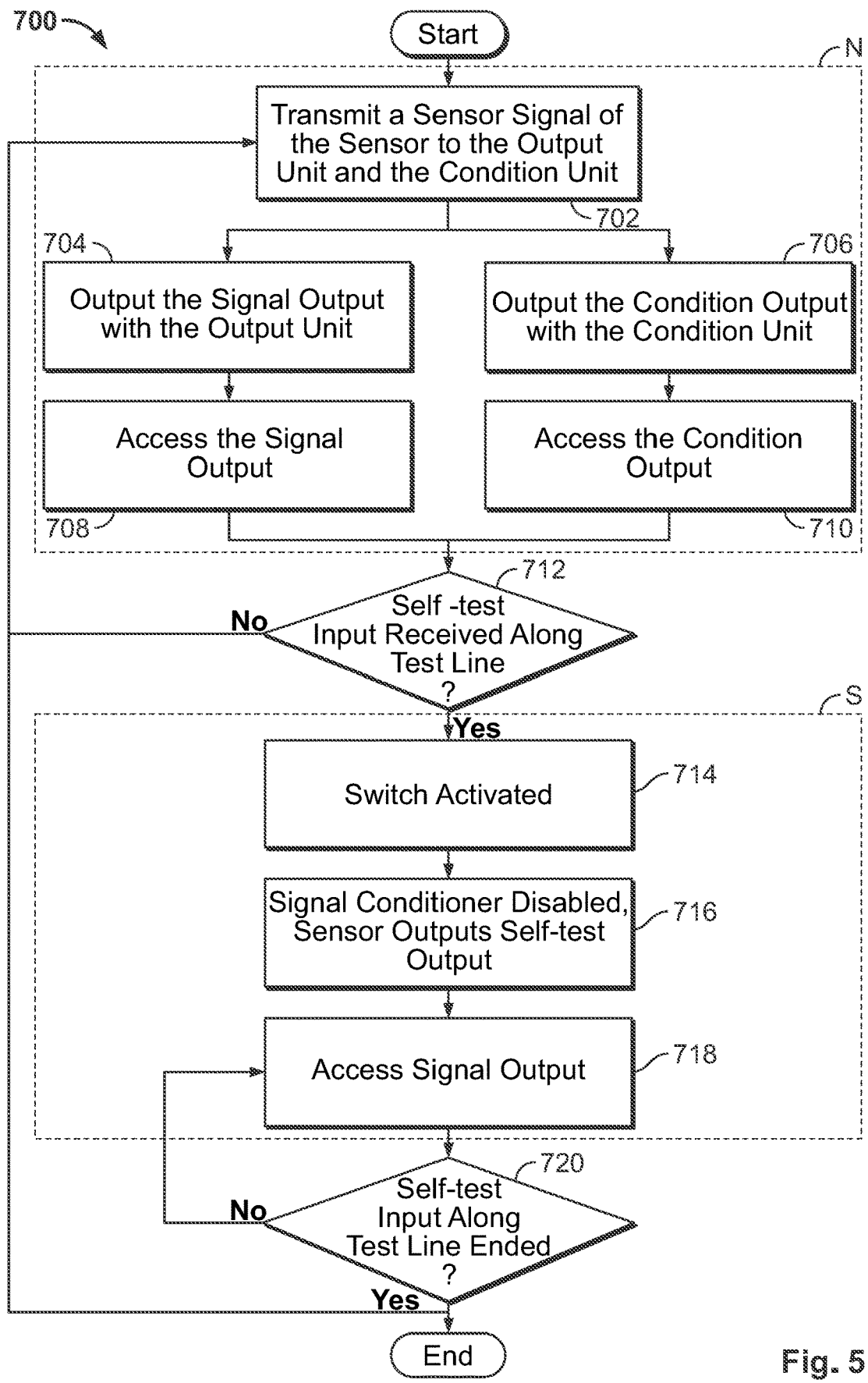
FIG. 5 is a flowchart of a method for outputting a condition of a sensor using the sensor assembly.

In a step 704 of FIG. 5, as described with respect to FIG. 2 above, the output unit 200 outputs the signal output 270 representative of the sensor signal 130 and the state detected by the sensor signal 130 to the signal line 500. Likewise, in a step 706, as described with respect to FIG. 3 above, the condition unit 300 outputs the condition output 380 representative of the condition of the sensor 100 to the test line 400. The condition output 380 has a sufficiently low voltage that the switch 600 is not triggered in the step 706. In the normal operating state N, the output unit 200 continuously outputs the signal output 270 to the signal line 500 and the condition unit 300 continuously outputs the condition output 380 to the test line 400.

In a step 708 of FIG. 5, the signal output 270 is assessed. The signal output 270 represents the state detected by the sensor 100 in the sensor signal 130; the significance of the first state or the second state of the signal output 270 will depend on the application. For example, in the exemplary liquid bubble detection application, the second state of the signal output 270 may indicate a dry state or a bubble in the liquid in the tube, which may prompt an alert or other action, while the first state of the signal output 270 may indicate the normal wet state of liquid in the tube. In other applications of the sensor assembly 10, the first state and the second state of the signal output 270 may prompt different measures.

In a step 710 of FIG. 5, the condition output 380 is assessed. The first condition of the condition output 380 indicates a normal condition of the sensor 100 in which the sensor 100 is operating normally. The second condition of the condition output 380 indicates a marginal condition of the sensor 100; the sensor 100 can continue to operate and provide a useful signal output 270 in the marginal condition, but the marginal condition indicates that the sensor 100 is approaching failure. The third condition of the condition output 380 indicates a failure condition of the sensor 100 in which the signal output 270 is not reliable.

As long as the self-test input 410 is not input to the test line 400 in a step 712 shown in FIG. 5, the sensor assembly 10 remains in the normal operating state N and continuously outputs both the signal output 270 and the condition output 380. When the self-test input 410 is input to the test line 400, the sensor assembly 10 switches to the self-test state S.

In a step 714 shown in FIG. 5, the self-test input 410 is transmitted along the test line 400 to the switch 600. The self-test input 410 is greater than the activation threshold of the switch 600 and activates the switch 600. When the switch 600 is activated, as shown in a step 716 in FIG. 5, a drive disable signal 610 from the switch 600 to the signal conditioner 120 disables a drive signal of the signal conditioner 120, which results in the sensor 100 outputting a self-test output 140 shown in FIG. 1 instead of the sensor signal 130. The self-test output 140 dictated by the drive disable signal 610 is a predefined value. The switch 600 bypasses the condition unit 300 in the self-test state S; the condition output 380 is not output at the test line 400 in the self-test state S.

The self-test output 140 is processed by the output unit 200 and output as the signal output 270 to the signal line 500 in the self-test state S. In a step 718 of the self-test state S shown in FIG. 5, the signal output 270 representing the self-test output 140 is compared to the self-test input 410. The self-test output 140 is intended to create a signal output 270 that matches the self-test input 410. A failure condition of the sensor 100 may be determined if the signal output 270 does not match the self-test input 410 in the self-test state S.

In a step 720 shown in FIG. 5, the sensor assembly 10 remains in the self-test state S and continues to assess the signal output 270 for a failure condition of the sensor 100 as long as the self-test input 410 is input to the test line 400. If the input of the self-test input 410 to the test line 400 has ended, the switch 600 switches back and the sensor assembly 10 proceeds in the normal operating state N, as shown in FIG. 5.

The sensor assembly 10 remains in the normal operating state N or the self-test state S until the sensor assembly 10 is deactivated, for example from a failure condition determination of the sensor 100 either in step 710 in the normal operating state N or in step 718 in the self-test state S.

In the sensor assembly 10 shown in FIGS. 1-5, the output unit 200, the condition unit 300, and the switch 600 achieve the above-described functions without requiring a microprocessor, which decreases the cost of the sensor assembly 10. In another embodiment of a sensor assembly 10' shown in FIG. 6, a controller 800 can perform the functions of the output unit 200, the condition unit 300, and the switch 600 described above. Like reference numbers refer to like elements in comparison to the embodiment shown and described above with respect to FIGS. 1-5, and primarily the differences of the embodiment shown in FIG. 6 related to the controller 800 will be described in detail.

Figure 6:
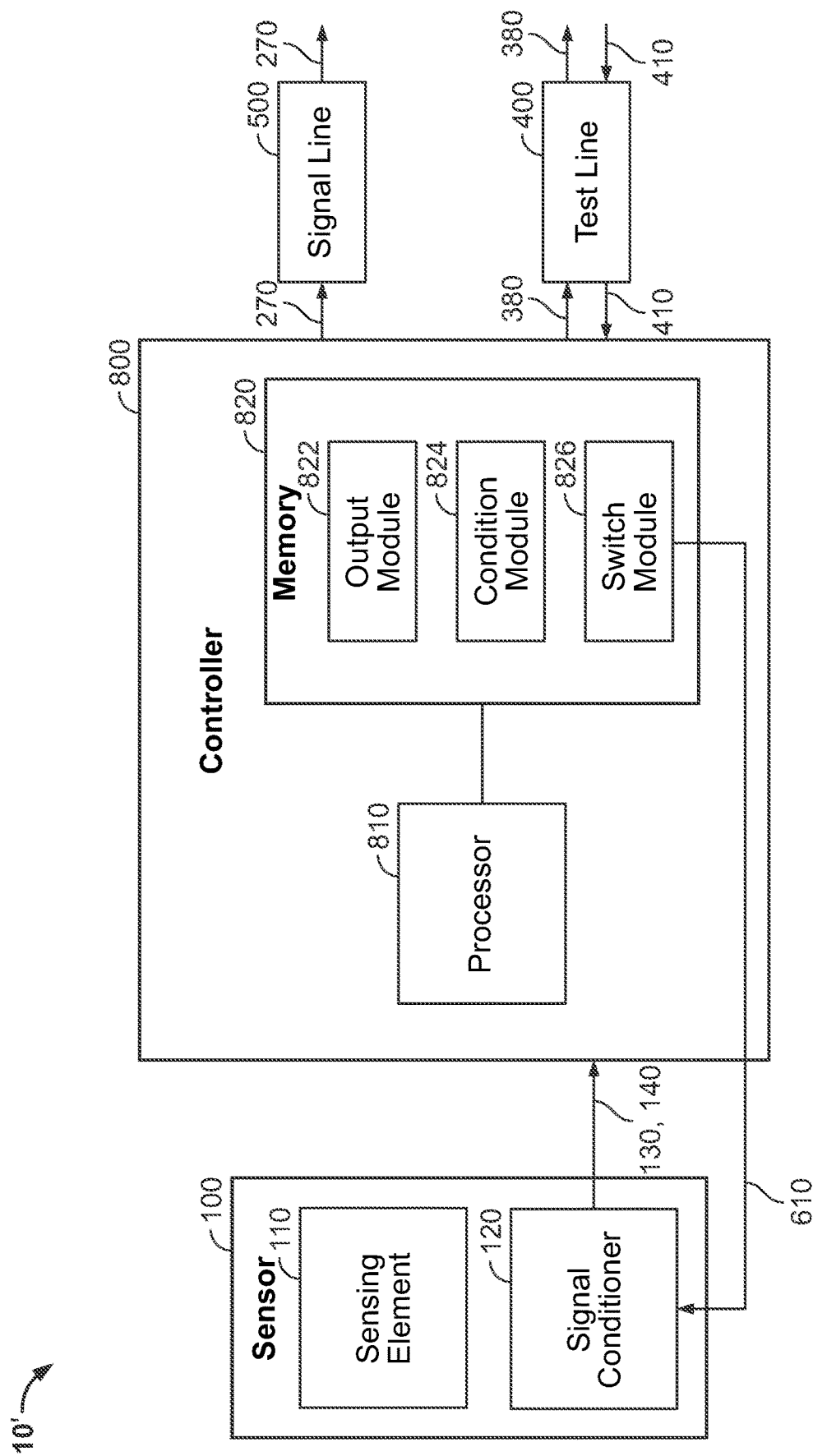
FIG. 6 is a schematic block diagram of a sensor assembly according to another embodiment.

As shown in FIG. 6, the controller 800 has a processor 810 and a memory 820 connected to the processor 810. The memory 820 is a non-transitory computer-readable medium storing a plurality of algorithms as modules thereon that, when executed by the processor 810, perform the functions of the modules described herein. The memory 820 stores an output module 822, a condition module 824, and a switch module 826. The output module 822 performs all the functions of the output unit 200 described above when executed by the processor 810, the condition module 824 performs all the functions of the condition unit 300 described above when executed by the processor 810, and the switch module 826 performs all the functions of the switch 600 described above when executed by the processor 810. The controller 800 therefore allows the sensor assembly 10' to perform the same function as the sensor assembly 10 described above, continuously outputting both the signal output 270 at the signal line 500 and the condition output 380 at the test line 400 in the normal operating state N, and outputting the signal output 270 representing the self-test output 140 of the sensor 100 in the self-test state S, while requiring fewer components.

The sensor assembly 10, 10' according to embodiments described above allows for a more reliable determination of the condition of the sensor 100 without adding any communication lines to the sensor assembly 10, 10'. The sensor assembly 10, 10' continuously outputs the condition output 380 while the signal output 270 is also output on the signal line 500, and provides a condition of the sensor 100 prior to an on-demand self-test input 410. The sensor assembly 10, 10' is also capable of indicating the marginal condition in the condition output 380 prior to the failure condition, providing warning of an impending failure while the sensor 100 is still outputting valid signal output 270. The sensor assembly 10, 10' further allows for initiation of the self-test state S through the bidirectional test line 400.

What is claimed is:

1. A sensor assembly, comprising:
a sensor generating a sensor signal;
an output unit generating:
a main signal based upon the sensor signal;
a baseline signal created by filtering or delaying the sensor signal; and
a signal output representative of a state detected by the sensor based on the sensor signal, the output unit compares the main signal and the baseline signal to determine the state detected by the sensor;
a condition unit receiving the sensor signal output from the sensor and outputting a condition output representative of a condition of the sensor, the condition output is independent of the signal output and represents one of a normal condition, a marginal condition, and a failure condition of the sensor, the condition unit compares the sensor signal to a plurality of thresholds to determine whether the condition of the sensor is the normal condition, the marginal condition, or the failure condition; and
a test line connected to the sensor and the condition unit, the test line is bidirectional and outputs the condition output.

2. The sensor assembly of claim 1, further comprising a signal line connected to the sensor and the output unit, the signal line is unidirectional and outputs the signal output.

3. The sensor assembly of claim 2, wherein, in a normal operating state, the output unit continuously outputs the signal output to the signal line and the condition unit continuously outputs the condition output to the test line.

4. The sensor assembly of claim 3, further comprising a switch connected between the sensor and the test line, the switch receives a self-test input along the test line to switch between the normal operating state and a self-test state of the sensor assembly.

5. The sensor assembly of claim 4, wherein the condition output is transmitted to the test line without triggering the switch in the normal operating state.

6. The sensor assembly of claim 4, wherein the condition unit outputs the condition output on the test line in the normal operating state and the switch bypasses the condition unit in the self-test state.

7. The sensor assembly of claim 6, wherein the sensor outputs a self-test output in the self-test state, the self-test output is dictated by a drive disable signal sent from the switch to a signal conditioner of the sensor.

8. The sensor assembly of claim 1, wherein the marginal condition indicates that the sensor is approaching failure.

9. The sensor assembly of claim 1, wherein the condition unit compares the baseline signal of the sensor signal to the thresholds to determine the condition of the sensor.

10. The sensor assembly of claim 1, wherein the signal output represents one of a pair of states detected by the sensor.

11. The sensor assembly of claim 1, wherein the output unit and the condition unit each have a plurality of voltage dividers, a comparator, and a level detection circuit creating the signal output and the condition output from the sensor signal.

12. The sensor assembly of claim 1, wherein the output unit and the condition unit are executed by a controller.

13. A method for outputting a condition of a sensor, comprising:
providing a sensor assembly including the sensor, an output unit connected to the sensor, a condition unit connected to the sensor, and a test line connected to the sensor and the condition unit, the test line is bidirectional;

transmitting a sensor signal of the sensor to the output unit and the condition unit;

generating a main signal and a baseline signal using a first output voltage divider and a second output voltage divider of the output unit, comparing the main signal and the baseline signal to determine a state detected by the sensor, and outputting a signal output representative of the state detected by the sensor with the output unit;

outputting a condition output representative of a condition of the sensor with the condition unit to the test line, the condition output is independent of the signal output, in a normal operating state, the output unit continuously outputs the signal output to a signal line connected to the sensor and the output unit, and the condition unit continuously outputs the condition output to the test line; and switching the sensor assembly between the normal operating state and a self-test state based on a self-test input received along the test line.

14. The method of claim 13, wherein the condition output represents one of a normal condition, a marginal condition, and a failure condition of the sensor.

15. The method of claim 13, wherein, in the self-test state, the sensor outputs a self-test output and bypasses the condition unit.

16. The method of claim 13, wherein the condition output has a plurality of condition voltage dividers and a plurality of comparators, the condition voltage dividers each output the baseline signal to one of the comparators.

17. The method of claim 16, wherein each of the comparators compares the baseline signal to a threshold voltage to determine the condition of the sensor.

18. A sensor assembly, comprising:
a sensor generating a sensor signal;
an output unit receiving the sensor signal output from the sensor and outputting a signal output representative of a state detected by the sensor;
a condition unit receiving the sensor signal output from the sensor and outputting a condition output representative of a condition of the sensor, the condition output is independent of the signal output, the output unit and the condition unit each have a plurality of voltage dividers, a comparator, and a level detection circuit creating the signal output and the condition output from the sensor signal; and
a test line connected to the sensor and the condition unit, the test line is bidirectional and outputs the condition output.

19. A sensor assembly, comprising:
a sensor generating a sensor signal;
an output unit generating:
a main signal based upon the sensor signal;
a baseline signal created by filtering or delaying the sensor signal; and
a signal output representative of a state detected by the sensor based on the sensor signal, the output unit compares the main signal and the baseline signal to determine the state detected by the sensor;
a condition unit receiving the sensor signal output from the sensor and outputting a condition output representative of a condition of the sensor, the condition output is independent of the signal output;
a test line connected to the sensor and the condition unit, the test line is bidirectional and outputs the condition output;
a signal line connected to the sensor and the output unit, the signal line is unidirectional and outputs the signal output, in a normal operating state, the output unit continuously outputs the signal output to the signal line and the condition unit continuously outputs the condition output to the test line; and
a switch connected between the sensor and the test line, the switch receives a self-test input along the test line to switch between the normal operating state and a self-test state of the sensor assembly.

20. The sensor assembly of claim 19, wherein the condition output is transmitted to the test line without triggering the switch in the normal operating state.

21. The sensor assembly of claim 19, wherein the condition unit outputs the condition output on the test line in the normal operating state and the switch bypasses the condition unit in the self-test state.

22. The sensor assembly of claim 21, wherein the sensor outputs a self-test output in the self-test state, the self-test output is dictated by a drive disable signal sent from the switch to a signal conditioner of the sensor.

* * * * *